United States Patent [19]

Gulczynski

[11] Patent Number: 4,837,572
[45] Date of Patent: Jun. 6, 1989

[54] DIGITAL-TO-ANALOG CONVERTER

[76] Inventor: Zdzislaw Gulczynski, P.O. Box 441, Winchester, Mass. 01890

[21] Appl. No.: 75,450

[22] Filed: Jul. 20, 1987

[51] Int. Cl.$^4$ ............................................. H03M 1/80
[52] U.S. Cl. .................................... 341/150; 341/144; 341/127
[58] Field of Search ........................................ 340/347

[56] References Cited

U.S. PATENT DOCUMENTS

| 4,200,863 | 4/1980 | Hodges et al. | 340/347 DA |
| 4,749,953 | 6/1988 | Gulczynski | 330/9 |
| 4,763,106 | 8/1988 | Gulczynski | 341/141 |

Primary Examiner—William M. Shoop, Jr.
Assistant Examiner—Helen Kim

[57] ABSTRACT

An ultra-fast high resolution digital-to-analog converter (DAC) converts a digital input code into a corresponding analog output voltage. The DAC has an inherent low impedance bipolar output.

In one embodiment, the DAC includes a resistor network coupled to a voltage source for providing a plurality of reference voltages. The DAC comprises a chain of capacitor/switch links each coupled via a pair of terminals, wherein the DAC output voltage appears across the chain. Each capacitor/switch link includes a capacitor, is responsive to a respective bit of the DAC input code and operates to couple the capacitor across the terminals when the bit is high, and connect the terminals when the bit is low. The respective reference voltages are also applied to the capacitors which are discharged only due to parasitic effects. The on-resistances of all individual switches and values of the capacitors employed in the DAC are insignificant.

19 Claims, 4 Drawing Sheets

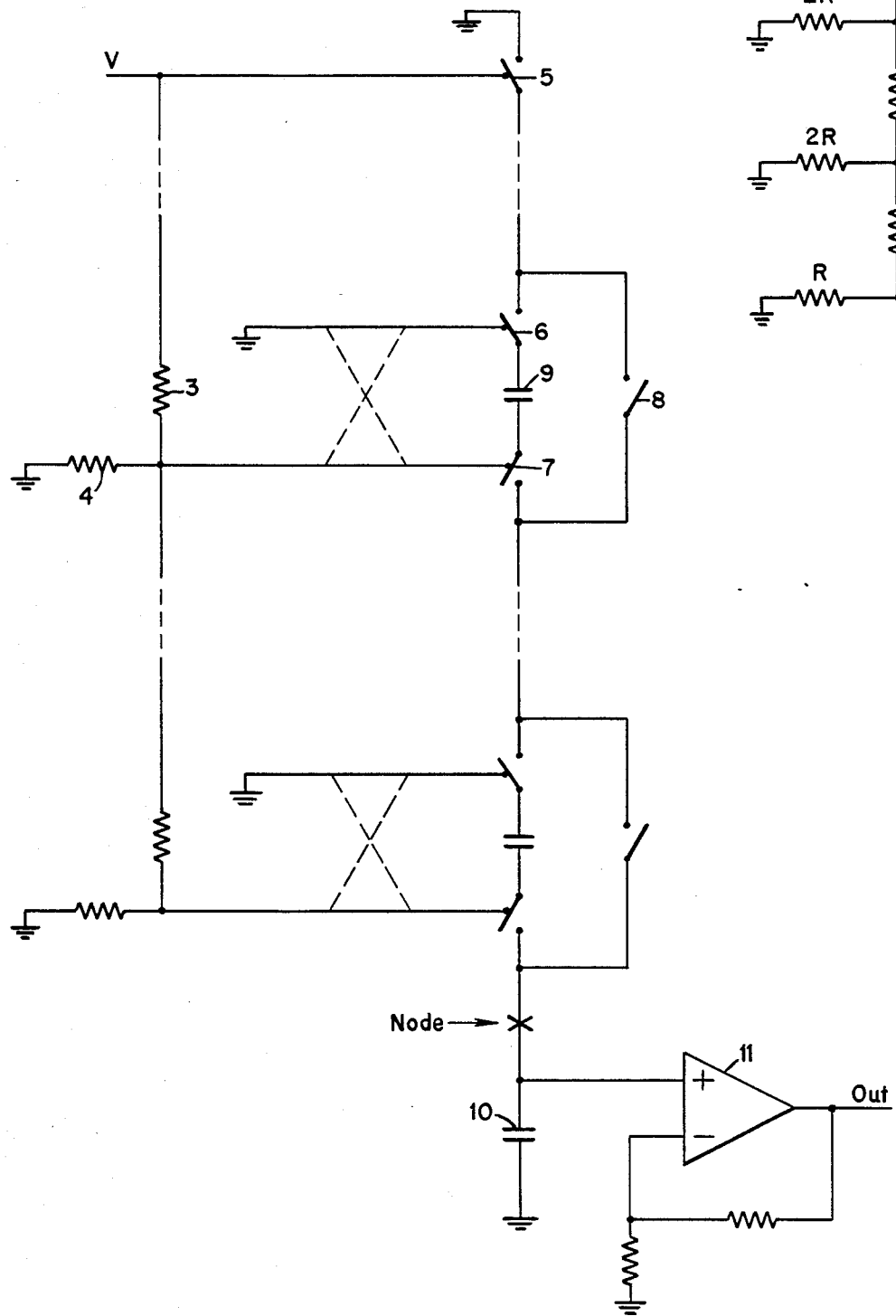
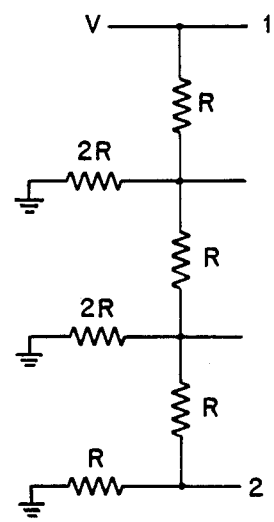
Fig.2
Fig.1

DIGITAL-TO-ANALOG CONVERTER

This application is related to: "Ultra Fast High Resolution Digital-to-Analog Converter" Ser. No. 304,507 filed 01/31/89; "High Accuracy Reference Ladder" Ser. No. 304,510 filed 01/31/89; "High Speed Integrating Analog-to-Digital Converter" Ser. No. 251,171 filed 09/30/88; "Flash Analog-to-Digital Converter with Integrating Input Stage" Ser. No. 248,495 filed 09/22/88; "Sampler-and-Hold Amplifier with Current Source Charger" Ser. No. 201,071 filed 05/27/88; "High Speed Integrating Digital-to-Analog Converter" Ser. No. 198,110 filed 05/24/88/; "Digital-to-Analog Converter with Digital Correction" Ser. No. 177,864 filed 03/23/88; "Flash Analog-to-Digital Converter" U.S. Pat. No. 4,763,106 dated 08/09/88; "Dual Flash Analog-to-Digital Converter" Ser. No. 075,448 filed 07/20/87; "Digital-to-Analog Converter" U.S. Pat. No. 4,811,017 dated 03/07/89; and "Operational Amplifier or Comparator Circuit with Minimized Offset Voltage and Drift" U.S. Pat. No. 4,749,953 dated 06/07/88. All inventions are by the same inventor.

BACKGROUND OF THE INVENTION

The invention generally relates to a digital-to-analog converter (DAC), particularly for systems requiring an ultra-fast high resolution conversion of a digital input code into a corresponding analog output voltage. The DAC has an inherent low impedance bipolar output.

Conventional DACs comprise a switch matrix controlled by the digital input code, and an associated resistor network which is used for obtaining binary weighted partial currents or voltages for a further adding in a summing unit. The partial currents are obtained by current sources each coupled to the summing unit directly or via a separate switch. The accuracy of the current sources practically determines the accuracy of the DAC. Furthermore, the switch on-resistance, linearity, temperature coefficient, etc. are insignificant. An output amplifier is necessary for obtaining a voltage proportional to the input code.

The DACs employing the resistor network for obtaining binary weighted voltages must use switches having precisely matched characteristics as the on-resistance thereof is added to selected resistances of the resistor network. A constant voltage drop across every closed switch must be maintained. However, the circuit structure is fairly simple as the reference voltage is directly divided by the resistor network.

Several designs combine good and bad features of both techniques described above. For instance, commonly known quad current source approach is based on binary weighted current sources, in groups of four. Parts of the circuit are repetitive which makes easier a monolithic integration. For instance, three such quads provide a 12 bit resolution. The circuit still requires current sources operating with three different currents and two accurately trimmed resistor networks with low temperature coefficients.

The disadvantages of conventional DACs are many. A resistor network is required with precisely trimmed resistors having up to N different values for an N-bit DAC. The binary weighted currents or voltages must employ respectively precisely matched switches or transistors of the current sources. Specific serial and/or parallel connections of the actually resistive switches or the current sources are often necessary for matching respective parameters and their temperature coefficients. As a result the monotonicity is difficult to achieve and the long term stability is poor. The parasitic capacitances as well as switching delays of the analog switches cause high transient voltage spikes. Output amplifiers are employed as DACs with current output and often low output impedance dependent on input code are of little use. Highly accurate output amplifiers must then be employed by the user as the inaccuracies of the amplifier are not initially taken into account.

SUMMARY OF THE INVENTION

The invention is intended to provide a very high resolution DAC having a voltage output and an extremely high conversion speed. Actually, the DAC according to the present invention offers a fastest possible input code conversion as the corresponding output voltage is determined immediately, whereby the structure of the DAC is extremely simple. A nonlinear transfer function can be obtained. The output is inherently bipolar and has low output impedance.

According to the present invention a DAC converts input code consisting of bits each having first or second value, into an output signal and comprises: a node with the output signal of the DAC appearing thereat, a pair of reference signal sources, a resistive means coupled to the reference signal sources for providing a plurality of reference voltages, a terminating means having an output for coupling one of the reference signal sources thereto, and a plurality of capacitor/switch means coupled in series between the node and terminating means output, each being responsive to a respective bit, having a pair of terminals used for the serial coupling, including a capacitor, and being operative to apply a respective reference voltage to the capacitor, couple the capacitor across the terminals when the bit has the first value, and connect the terminals when the bit has the second value.

In another embodiment the DAC comprises: a node with the output signal of the DAC appearing thereat, a current means for providing a reference current to the node during a charging period, a voltage source means for providing a reference voltage, and a plurality of capacitor/switch means coupled in series between the node and the voltage source means, each being responsive to a respective bit, having a pair of terminals used for the serial coupling, including a capacitor and being operative to short out the capacitor before the charging period, couple the capacitor across the terminals during the charging period and thereafter when the bit has the first value, and connect the terminals after the charging period when the bit has the second value.

BRIEF DESCRIPTION OF THE DRAWINGS

The present invention will become more clear in conjunction with the accompanying figures of which:

FIG. 1 is an ordinary R-2R resistor ladder for providing binary weighted reference voltages;

FIG. 2 is an embodiment with capacitors being coupled to ground;

Throughout the drawings, similar references denote similar parts

DETAILED DESCRIPTION OF THE INVENTION

Figure 3:
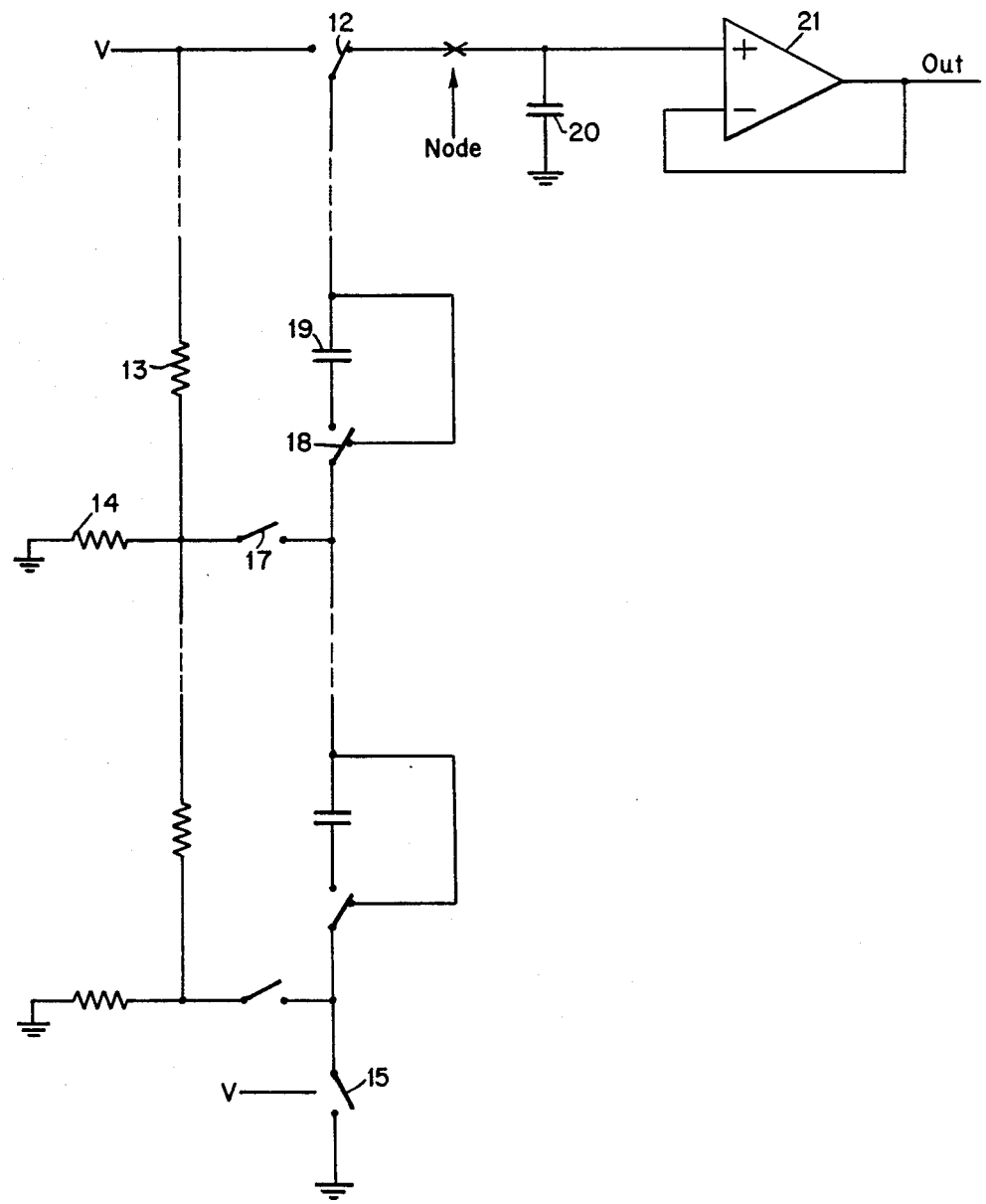
FIG. 3 is the preferred embodiment.

FIG. 1 is an ordinary R-2R resistor ladder for providing binary weighted reference voltages. Generally, this resistor network is coupled between two reference signal sources one of which can be a current source. In the present embodiment, the network is coupled between the reference voltage source V and ground. The source V provides also one of the reference voltages as it is coupled directly to the network. The network consists of a chain of R—R voltage dividers so that the voltage of the reference voltage source V is successively divided by two. All resistors coupled to ground, except for the resistor coupled to the output 2, are 2R. All other resistors have value R. For instance, the voltages appearing at the outputs 1 and 2 of the network are equal to the voltage of the source V and ½ thereof respectively.

FIG. 2 is an embodiment with capacitors being coupled to ground. The DAC comprises the reference voltage source V, a chain of resistors for providing reference voltages, a chain of capacitor/switch means coupled between output of a terminating means and a node, and an optional amplifier. The output signal of the DAC appears at the node. The resistor chain, e.g. as shown in FIG. 1, can be used for providing binary weighted reference voltages. The DAC input code consists of bits each effecting respective switches of the capacitor/switch and terminating means. Each capacitor/switch means has a pair of terminals, indicated by the dashed lines in the drawing, separately coupled to the respective terminals of a pair of adjacent capacitor/switch means. Thereby, the chain structure is established. The conversion takes place in two phases.

Each capacitor/switch means consists of a single capacitor and three switches. During the first conversion phase a respective reference voltage deriving from the resistor network is applied to the capacitor 9. Specifically, one terminal thereof is coupled to ground via the switch 6, and the other terminal to the resistors 3 and 4 via the switch 7. Thus, the reference voltage appearing across the resistor 4 is applied to the capacitor 9. The position of the switch 8 is not essential.

On the beginning of the second conversion phase the switches 6 and 7 are switched if the respective bit of the DAC input code has a first value, e.g. is high. The switch 8 is open. By this means the respective reference voltage stored in the capacitor 9 and substantially equal to the voltage drop across the resistor 4 is applied to the terminals of the capacitor/switch means as the capacitor 9 is coupled thereacross. Similarly, the switches 6 and 7 remain unchanged and the switch 8 is closed if the bit has a second value, i.e. low respectively. The reference voltage is still applied to the capacitor 9 and the terminals of the capacitor/switch means are connected via the switch 8.

The voltage appearing across the terminals of the capacitor/switch means is thus substantially equal to the respective reference voltage or zero if the respective bit of the DAC input code is high or low respectively. The addition of the capacitor voltages is accomplished thru the chain structure of the DAC and in response to the input code thereof. Furthermore, a capacitor voltage can be reversed by the switches 6 and 7. This is indicated by the dashed lines in FIG. 2 as the respective terminals of the switches 6 and 7 can be exchanged.

The DAC according to the present invention has an inherent bipolar output. Moreover, the voltage of the reference voltage source V, having a value V, can be almost doubled and also reversed as the FSR (full scale range) is 2V−1LSB. For instance, the DAC output voltage can range from −2V+1LSB to 0 or from −V to V−1LSB. However, the voltage doubling is optional and can be determined by a bit, possibly MSB. Furthermore, a nonlinear transfer function can be accomplished by choice of the individual resistor values since the reference voltages stored in the capacitors are added and/or subtracted. The MSBs and LSBs are most and least significant bits attained by dividing the DAC input code into two codes of adjacent bits.

The DAC has the terminating means having an output for coupling thereto one of the reference signal sources, such as ground. In the present embodiment the terminating means is responsive to a respective bit, e.g. MSB, for applying a respective reference voltage, such as of source V, to the terminating means output. The terminating means consists of the switch 5 providing the output and is coupled to a terminal of the capacitor/switch means terminating the chain. The position of the switch 5 during the first conversion phase is insignificant. During the second conversion phase the terminating means output is coupled to V or ground if the MSB is high or low respectively.

As mentioned, the chain of the capacitor/switch means is coupled between the terminating means output and node. The output signal of the DAC appears at the node. The energy which can be obtained thereat depends on the input code of the DAC determining the combined capacitance, and the corresponding output voltage.

The optional amplifier is coupled in series with the DAC output signal for amplifying the signal and obtaining low output impedance of the DAC. The amplifier consists of the operational amplifier (OA) 11 having noninverting input coupled to the node. The inverting input receives a portion of the OA 11 output voltage from a resistor divider which also determines the amplifier gain. The output voltage of the OA 11 corresponds to the DAC input code. The on-resistance of all individual switches employed in the DAC is insignificant as the switches are coupled in series with the high impedance noninverting input of the OA 11. Moreover, the values of the individual capacitors are insignificant.

Ideally, the first conversion phase is unnecessary as the capacitors once charged always hold the respective voltages. However, the leakage current of the capacitors, parasitic capacitances of the switches, input bias current of the OA 11, etc., do alter the stored voltages. During the first conversion phase the DAC output signal may be unknown and can be thus interrupted. For that purpose the switch coupled between the terminals of one of the capacitor/switch means, such as 8, can be open. In order to minimize transient voltage spikes the capacitor 10 coupled between the node and ground is employed. The capacitor value should be significantly smaller than of all remaining capacitors coupled in series. The capacitor 10 is optional since the OA 11 has a limited bandwidth and performs an integration.

The first conversion phase can be executed simply by applying a DAC input code having respective bits low, once in a while and during a very short period of time, wherein the DAC output signal can be interrupted. The phase can be thus executed periodically and without any user's effort. This kind of operation is similar to that of dynamic RAMs requiring a periodic refresh. It shall be pointed out that all capacitors are discharged only due to parasitic effects.

FIG. 3 is the preferred embodiment. The DAC comprises the reference voltage source V, a chain of resistors for providing reference voltages, a chain of capacitor/switch means coupled between output of a terminating means and a node, and an optional amplifier. The output signal of the DAC appears at the node. The resistor chain, e.g. as shown in FIG. 1, can be used for providing binary weighted reference voltages. Each bit of the DAC input code effects respective switches of the capacitor/switch and terminating means. Each capacitor/switch means has a pair of terminals, indicated by the dashed lines in the drawing, separately coupled to the respective terminals of a pair of adjacent capacitor/switch means. Thereby, the chain structure is established. The conversion takes place in two phases.

During the first conversion phase a respective reference voltage deriving from the resistor network is applied to the capacitor 19. Specifically, the terminals thereof are coupled to the resistors 13 via the switches 17, 18 and a switch corresponding to the switch 17 included in the adjacent capacitor/switch means coupled to the capacitor 19. Thus, the reference voltage appearing across the resistor 13 is applied to the capacitor 19.

Each capacitor/switch means comprises a single capacitor coupled to one of the terminals thereof and two switches. However, the capacitor/switch means coupled to the node includes a third switch for applying a respective reference voltage to the capacitor. Therefore, the switch 12 is coupled to the voltage source V and the input of the OA 21, as discussed hereinbelow, when the respective bit is high and low respectively. As mentioned, the source V is the reference source which also provides one of the reference voltages.

On the beginning of the second conversion phase the switch 17 is open. The switch 18 is unchanged if the respective bit of the DAC input code is high. By this means the respective reference voltage stored in the capacitor 19 and substantially equal to the voltage drop across the resistor 13 is applied to the terminals of the capacitor/switch means as the capacitor 19 is coupled thereacross. Similarly, the switch 18 is switched if the bit is low for connecting the terminals. The voltage appearing across the terminals of the capacitor/switch means is thus substantially equal to the respective reference voltage or zero if the respective bit of the DAC input code is high or low respectively. It shall be pointed out that the capacitors are discharged only due to parasitic effects.

The DAC includes the terminating means having an output for coupling thereto one of the reference signal sources, such as ground. In the present embodiment the terminating means is also responsive to a respective bit, e.g. LSB, for applying a respective reference voltage, such as of source V, to the terminating means output. The means consists of the switch 15 providing the output which is coupled to the terminal of a capacitor/switch means terminating the chain. The switch 15 disconnects the terminating means output during the first conversion phase. During the second phase the output is coupled to V or ground if the LSB is high or low respectively.

As mentioned, the chain of capacitor/switch means is coupled between the terminating means output and node with the DAC output signal appearing thereat. The optional voltage follower comprising the OA 21 is coupled to the node for obtaining low output impedance of the DAC. The on-resistances of all individual switches and values of all capacitors employed in the DAC are insignificant.

The optional capacitor 20 is coupled between the node and ground for minimizing transient voltage spikes. As mentioned, the capacitor/switch means coupled to the node includes a capacitor and the switch 12 which, during the first conversion phase, is switched for applying the reference voltage to the capacitor and interrupting the DAC output signal. Two separate switches can be substituted for the switch 12, one coupled between the source V and node, and the other coupled to the node and in series with the DAC output signal.

The voltage of the source V can be almost doubled and also reversed as the FSR is 2V−1LSB. For instance, the DAC bipolar output voltage in range from −V+1LSB to V can be obtained simply by exchanging the node and terminating means output.

Figure 4:
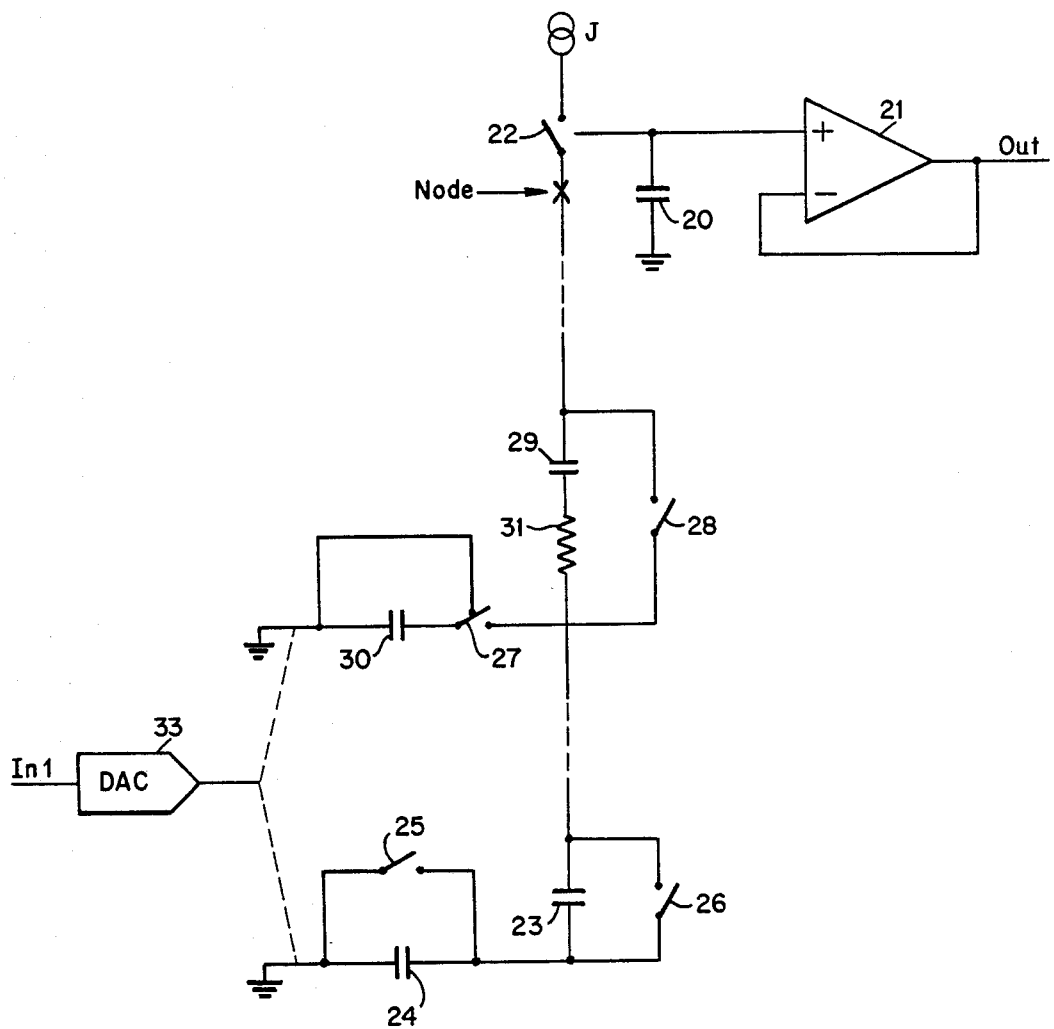
FIG. 4 is an embodiment eliminating high accuracy resistors.

FIG. 4 is an embodiment eliminating high accuracy resistors. The resistor network is unavoidable in conventional DACs and causes deficient long term and temperature stability, reduced accuracy, enlarged chip space, increased power consumption, etc. On the contrary integrated MOS capacitors are most accurate IC components. For instance, their absolute accuracy and tolerance fluctuation due to time, mechanical stress and voltage are far superior to any other component.

The DAC comprises a current source means, a chain of capacitor/switch means, and an optional amplifier. The chain is coupled between a node and reference voltage source such as ground. The output signal of the DAC appears at the node. A current means is coupled for providing a reference current to the node during a charging period. Each capacitor/switch means has a pair of terminals, indicated by the dashed lines in the drawing, separately coupled to the respective terminals of a pair of adjacent capacitor/switch means. Thereby, the chain structure is established.

At first, a simplified embodiment is described, as shown in FIG. 4 but without the capacitor 30, switch 27 and resistor 31. Each capacitor/switch means comprises a capacitor and switch, such as 23 and 26, coupled in parallel between the terminals of the means. All capacitors are shorted out and discharged by closing the respective switches before the charging period. All switches are open and current is applied to the node during the charging period for charging the capacitors to predetermined voltages. The DAC output signal appears across the chain thereafter as each switch remains open or is closed if the respective bit of the DAC input code is high or low respectively. Therefore, the DAC output signal is the sum of the capacitor voltages unaffected by open switches. The drawback of the simplified embodiment is that the N-bit DAC requires N different capacitor values. This number is reduced when at least one capacitor/switch means includes a second capacitor and a second switch.

The DAC, as shown in FIG. 4, requires only two capacitor values. The capacitor/switch means comprise a pair of capacitors, pair of switches and an optional resistor, such as 27 thru 31. However, the capacitor/switch means terminating the chain and comprising capacitors and switches 23 thru 26 has a slightly different structure. Before the charging period the switches 25 thru 28 are switched so that the capacitors 23, 24, 29 and 30 are shorted out. Subsequently, all switches are switched, whereby the switch 22 couples the reference current source J to the node. During the charging period each capacitor is charged to a voltage which depends upon the current of the source J, length of the charging period, the capacitor value and its location. The capacitors 29, 30 and 23, 24 are coupled in series and act as current/voltage divider. A binary weighting of the capacitor voltages can be obtained if the capacitors 23, 24 and 29 have a value C and the capacitor 30 value 2C, similarly to the resistor network of FIG. 1.

After the charging period the switch 27 is switched for shorting and disconnecting the capacitor 30. The switch 25 is also switched and shorts out the capacitor 24, whereas ground connection is substituted therefor. The switches 26 and 28 remain open or are closed if the respective bits of the DAC input code are high or low respectively. Thereby, the capacitor voltages selected according to the input code are added by means of the capacitors coupled in series.

As mentioned, the chain of capacitor/switch means is coupled between ground and the node with the DAC output signal appearing thereat. The optional voltage follower comprising the OA 21 is employed for obtaining low output impedance of the DAC. The optional capacitor 20 is coupled between the OA 21 noninverting input and ground for minimizing transient voltage spikes. Before the charging period, the node is coupled to ground as the capacitors of the capacitor/switch means are shorted out. However, the switch 22 disconnects the current source J for achieving a higher accuracy as the on-resistances of the switches would cause a voltage drops thereacross. During the charging period, the switch 22 couples current source J to the node. Finally, the source J is disconnected and the DAC output signal, interrupted hitherto, is applied to the noninverting input of the OA 21 via the switch 22.

The DAC output voltage depends upon the current of the source J, length of the charging period and the capacitor values. Specific functions of analog nature can be accomplished by manipulating the current and period length.

During the charging period, the current of the reference current source J is successively divided by the capacitors. However, the capacitors coupled to ground are also coupled in series with the respective switches, except for the capacitor 24 and switch 25 of the capacitor/switch means terminating the chain. The capacitor 30 is coupled in series with the switch 27 which also causes a voltage drop due to its on-resistance. In order to minimize this effect the optional resistor 31 is employed for obtaining an equal voltage drop. The resistor 31 is coupled in series with the capacitor 29 during the charging period and also limits a discharging current prior thereto.

All capacitors must be discharged before a new charging period. However, the capacitors coupled to ground are active only during the charging period and can be shorted before and/or after the charging period. The remaining capacitors must be shorted before the charging period. However, in the present embodiment, they are also shorted out thereafter when the respective bits are low. In this manner, all capacitors can be shorted before the charging period by applying the DAC input code having all bits low.

As mentioned, the chain of the capacitor/switch means is coupled between the node and reference voltage source which is ground in the above embodiment. In other embodiment each of the capacitor/switch means, and therefore the entire chain, is coupled to the output of the DAC means 33 rather than ground. This is indicated by the dashed lines in FIG. 4. The chain is responsive to the MSBs or LSBs of DAC input code while the DAC means 33 is responsive to the LSBs or MSBs, respectively, applied to the input In1 thereof. For example, each capacitor/switch means is responsive to a respective bit of the MSBs. The DAC means 33 provides a reference voltage, whereby the output signal of the entire circuit can be shifted up and down in response to the MSBs or LSBs for obtaining a unipolar or bipolar output. Furthermore, the DAC means 33 can be used for the purpose of any digital correction.

Figure 5:
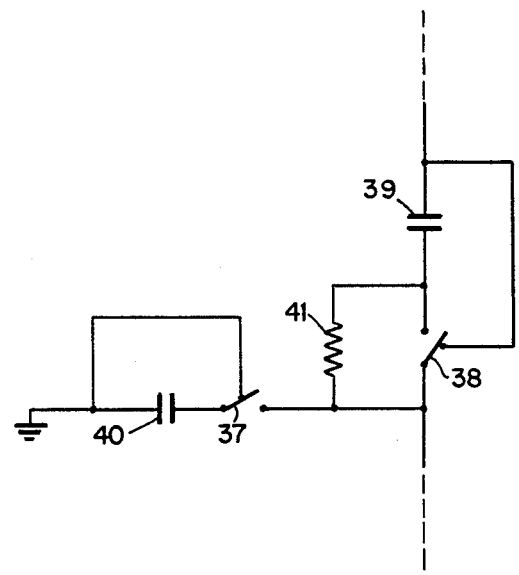
FIG. 5 is a capacitor/switch means for the FIG. 4 embodiment for a higher accuracy.

FIG. 5 is an capacitor/switch means for the FIG. 4 embodiment for a higher accuracy as the on-resistance of the switch 38 acts like the resistor 31 of FIG. 4. During the charging period the switches 37 and 38 are switched so that the capacitors 39 and 40 are coupled in series and act as current/voltage divider. Assuming the binary weighting of the capacitor values described hereinabove, the current flowing thru the switch 38 is two times higher than the current flowing thru 37.

After the charging period the switch 37 is switched for shorting and disconnecting the capacitor 40. The switch 38 remains unchanged if the respective bit of the DAC input code is high. If the bit is low, the switch 38 is switched, whereby the capacitor 39 is shorted via the switch 38 and the resistor 41 coupled in series. The on-resistance of the switch 38 is essentially not influenced by the presence of the resistor 41 having a much higher value.

Figure 6:
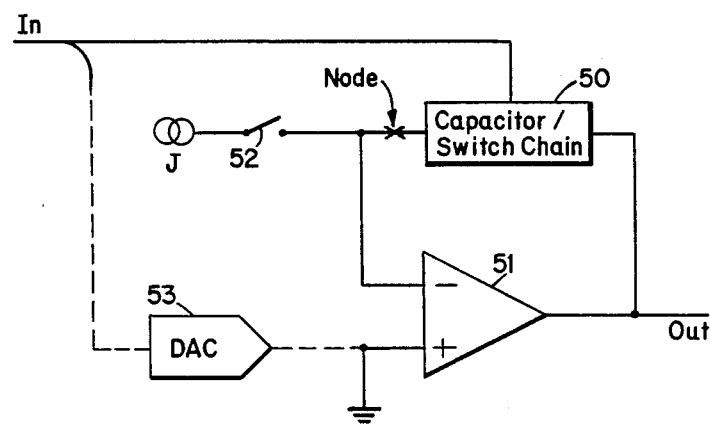
FIG. 6 is an embodiment with a feedback.

FIG. 6 is an embodiment with a feedback. The DAC includes the OA 51 having the inverting input coupled to the node and the noniverting input coupled to a voltage source, which is ground in the present embodiment. The DAC output signal appears at the output of the OA 51 in response to the DAC input code. The chain of the capacitor/switch means 50, responsive to the DAC input code, is coupled between the node and the output of the OA 51 and thus constitutes the feedback path thereof. Examples of the chain 50 are embodied in FIG. 4 and FIGS. 4 and 5, whereby the operation is the same. The chain 50 is coupled to the output of the OA 51 rather than ground. The switch 52 couples the current source J to the node during the charging period, similarly to the switch 22 of FIG. 4. A voltage source coupled in series with a resistor can be used as the current source J.

In another embodiment, the noninverting input of the OA 51 is coupled to the output of the DAC means 53 as indicated by the dashed line. The chain 50 is responsive to the MSBs or LSBs while the DAC means 53 is responsive to the LSBs or MSBs respectively. For instance, each capacitor/switch means of the chain 50 is responsive to a respective bit of the MSBs. The DAC means 53 provides a reference voltage, whereby the output voltage of the OA 51 is referenced thereto. By this means the output signal of the entire circuit can be shifted up and down in response to MSBs or LSBs for obtaining a unipolar or bipolar output. Furthermore, the DAC means 53 can be used for the purpose of any digital correction. The output impedance of the DAC means 53 can be relatively high as it is coupled in series with high impedance noninverting input of the OA 51.

The simplicity of the embodiments according to the present invention will become even more clear by specifying the components. The embodiments of FIGS. 4 thru 6 require the lowest number of components with the capacitors having two accurate values. A 16-bit DAC with a 10 V reference voltage according to the preferred embodiment shown in FIG. 3 requires 30 resistors having two accurate values. It also requires 15 capacitors and 32 switches set to specific positions during the first conversion phase, 16 of which are responsive to the respective bits of the DAC input code during the second conversion phase. The capacitors can have any values, possibly significantly higher than switch parasitic capacitances for minimizing any effect thereof. The FSR of the DAC is 19.999 V.

The embodiments of the present invention described herein are intended to be taken in an illustrative and not a limiting sense. Various modifications and changes may be made to these embodiments by persons skilled in the art without departing from the scope of the present invention as defined in the appended claims.

I claim:

1. Digital-to-analog converter for converting a input code consisting of bits each having first or second value, into an output signal, comprising:
   a node with the output signal of the digital-to-analog converter appearing thereat;
   a pair of reference signal sources;
   a resistive means coupled to the reference signal sources for providing a plurality of reference voltages;
   a terminating means having an output for coupling one of the reference signal source thereto; and
   a plurality of capacitor/switch means coupled in series between the node and terminating means output, each being responsive to a respective bit, having a pair of terminals used for the serial coupling, including a capacitor, and being operative to apply a respective reference voltage to the capacitor, couple the capacitor across the terminals when the bit has the first value, and connect the terminals when the bit has the second value.

2. Digital-to-analog converter of claim 1, wherein each capacitor/switch means includes switch means for coupling the capacitor across the terminals of the capacitor/switch means when the respective bit has the first value, and for applying the respective reference voltage to the capacitor when the bit has the second value.

3. Digital-to-analog converter of claim 2, wherein the terminating means includes a terminating switch means responsive to a respective bit for applying a respective reference voltage to the terminating means output when the bit has the first value and coupling the reference signal source to the terminating means output when the bit has the second value.

4. Digital-to-analog converter of claim 1, wherein the capacitor of any capacitor/switch means is coupled to one of the terminals thereof.

5. Digital-to-analog converter of claim 4, wherein each capacitor/switch means includes switch means for coupling the capacitor to the other terminal of the capacitor/switch means and concurrently applying the respective reference voltage thereto.

6. Digital-to-analog converter of claim 5, further including output switch means for interrupting the output signal of the digital-to-analog converter while the respective reference voltage is applied to the capacitor of any capacitor/switch means.

7. Digital-to-analog converter of claim 5, wherein the terminating means includes a switch means responsive to a respective bit for applying a respective reference voltage to the terminating means output when the bit has the first value and coupling the reference signal source to the terminating means output when the bit has the second value.

8. Digital-to-analog converter of claim 7, wherein the switch means disconnects the terminating means output while the respective reference voltage is applied to the capacitor of any capacitor/switch means.

9. Digital-to-analog converter of claim 1, further including an amplifier coupled in series with the output signal of the digital-to-analog converter.

10. Digital-to-analog converter for converting input code consisting of bits each having first or second value, into an output signal, comprising:
    a node with the output signal of the digital-to-analog converter appearing thereat;
    a current means for providing a reference current to the node during a charging period;
    a voltage source means for providing a reference voltage; and
    a plurality of capacitor/switch means coupled in series between the node and the voltage source means, each being responsive to a respective bit, having a pair of terminals used for the serial coupling, including a capacitor and being operative to short out the capacitor before the charging period, couple the capacitor across the terminals during the charging period and thereafter when the bit has the first value, and connect the terminals after the charging period when the bit has the second value.

11. Digital-to-analog converter of claim 10, wherein at least one capacitor/switch means includes a second capacitor and switch means for shorting the second capacitor before and/or after the charging period, and coupling the second capacitor between the voltage source means and one of the terminals of the capacitor/switch means during the charging period.

12. Digital-to-analog converter of claim 11, wherein at least one capacitor/switch means includes a resistor coupled in series with the respective first said capacitor at least during the charging period.

13. Digital-to-analog converter of claim 10, wherein each capacitor/switch means includes switch means for shorting the capacitor after the charging period when the respective bit has the second value.

14. Digital-to-analog converter of claim 13, further including means for applying the input code of the digital-to-analog converter with bits having the second value.

15. Digital-to-analog converter of claim 10, further including switch means for interrupting the output signal of the digital-to-analog converter before and during the charging period.

16. Digital-to-analog converter of claim 10, further including an amplifier coupled in series with the output signal of the digital-to-analog converter.

17. Digital-to-analog converter of claim 10, further including means for dividing the input code into a first and second codes of adjacent bits,
    wherein each capacitor/switch means is responsive to a respective bit of the first code, and
    further wherein the voltage source means includes a digital-to-analog converter means for providing the reference voltage in response to the second code.

18. Digital-to-analog converter of claim 10, further including an operational amplifier having an inverting input coupled to the node, a noniverting input coupled to the voltage source means, and an output with the output signal of the digital-to-analog converter appearing thereat,
  wherein the plurality of capacitor/switch means is coupled between the node and the output of the operational amplifier.

19. Digital-to-analog converter of claim 18, further including means for dividing the input code into a first and second codes of adjacent bits,
  wherein each capacitor/switch means is responsive to a respective bit of the first code, and
  further wherein the voltage source means includes a digital-to-analog converter means for providing the reference voltage in response to the second code.

* * * * *